(12) United States Patent
Herdin

(10) Patent No.: US 12,287,368 B2
(45) Date of Patent: Apr. 29, 2025

(54) METHOD FOR GENERATING A SIGNAL TEST SPECIFICATION, DATA PROCESSING CIRCUIT, AND CLOUD SYSTEM

(71) Applicant: Rohde & Schwarz GmbH & Co. KG, Munich (DE)

(72) Inventor: Markus Herdin, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 413 days.

(21) Appl. No.: 17/824,711

(22) Filed: May 25, 2022

(65) Prior Publication Data
US 2023/0384371 A1    Nov. 30, 2023

(51) Int. Cl.
*G01R 31/00*    (2006.01)
*G01R 31/317*    (2006.01)
*G01R 31/3183*    (2006.01)

(52) U.S. Cl.
CPC . *G01R 31/31721* (2013.01); *G01R 31/31725* (2013.01); *G01R 31/3183* (2013.01)

(58) Field of Classification Search
None
See application file for complete search history.

(56) References Cited

U.S. PATENT DOCUMENTS

| | | | |
|---|---|---|---|
| 2011/0270548 A1* | 11/2011 | Zuo | G01R 31/3008 702/60 |
| 2018/0335453 A1 | 11/2018 | Diegmann | |
| 2020/0284839 A1 | 9/2020 | Diegmann | |

OTHER PUBLICATIONS

Pereles, David. Nov. 2017, Ease Power-SEquencing Verfication with an 8-OChannel Oscilloscope.*
Parzian, Alessio. Aug. 2015. Java Card Bytecode Verification.*
"Ease Power-Sequencing Verification with an 8-Channel Oscilloscope," Electronic Design, <http://www.electronicdesign.com/test-measurement/ease-power-sequencing-verification-8-channel-oscilloscope>, Dec. 11, 2017, 10 pages.
"Verifying power sequencing for FPGAs, CPUs and DSPs," Rohde & Schwarz GmbH & Co. KG, Application Card; Version 01.00, Sep. 2018, 2 pages.

\* cited by examiner

*Primary Examiner* — Tuankhanh D Phan
(74) *Attorney, Agent, or Firm* — CHRISTENSEN O'CONNOR JOHNSON KINDNESS PLLC

(57) ABSTRACT

The present disclosure generally relates to a method for generating a signal test specification, a data processing circuit, and a cloud system. The signal test specification is to be applied by a measurement device for testing a device under test. At least one first voltage requirement and at least one first timing requirement for a first power rail signal of the device under test to be tested are stored in a structured file format. At least one second voltage requirement and at least one second timing requirement for a second power rail signal of the device under test to be tested are stored in a structured file format. At least one relative constraint having a relation between at least two of voltage requirements and timing requirements is stored in a structured file format.

17 Claims, 5 Drawing Sheets

METHOD FOR GENERATING A SIGNAL TEST SPECIFICATION, DATA PROCESSING CIRCUIT, AND CLOUD SYSTEM

FIELD OF THE DISCLOSURE

The present disclosure generally relates to a method for generating a signal test specification, a data processing circuit, and a cloud system.

BACKGROUND

Complex electronic devices such as field-programmable gate arrays (FPGAs) or application-specific integrated circuits (ASICs) are used in manifold devices nowadays. When developing and testing the devices containing a complex electronic device (CED), a plurality of different supply voltages need to be applied for ensuring correct functionality of the CED. Importantly, the different supply voltages may usually not be applied simultaneously, but a specific sequence is required since certain portions (power rails) of the CED need to be powered prior to others. This testing procedure is generally also referred to as power sequence testing or power sequence verification.

Accordingly, not only voltage requirements and timing requirements have to be guaranteed with respect to each individual power rail signal, but also relative conditions between different power rail signals have to be considered.

According to a known approach, the voltage requirements and timing requirements for each power rail signal as well as the relative conditions are considered manually by a testing person when evaluating the CED with regard to its correct functionality during a testing procedure. However, this approach is time-consuming and causes high labor costs, thus being inefficient from an economic point of view. Moreover, the number of different requirements and conditions is large causing a severe risk for disregarding the appropriate sequence of the power sequence testing. These potential risks are further strengthened since usually many repetitions of a testing procedure have to applied for ensuring correct functionality of the CED with high confidence.

Accordingly, there is need for a cost-effective and improved approach to avoid the aforementioned risks in view of a power sequence verification to be applied. In particular, there is a need for a method, a data processing circuit, and a cloud system based on which the aforementioned disadvantages may be avoided or may at least be reduced.

SUMMARY

The disclosed subject matter satisfies these respective needs of others. Various embodiments, for example, are indicated in the following description, each of which, individually or in combination, may represent aspects of the disclosure. Some specifics of the present disclosure are described with regard to devices and others with regard to corresponding methods. However, the advantages and representative embodiments described with regard to the indicated devices are correspondingly to be transferred to the according methods and vice versa.

The following summary is provided for certain embodiments disclosed herein. It should be understood that these aspects are presented merely to provide a brief summary of these certain embodiments and that these aspects are not intended to limit the scope of this disclosure. This disclosure may encompass a variety of aspects that may not be set forth below.

In accordance with an embodiment of the disclosure, a computer-implemented method for generating a signal test specification is provided. The signal test specification is to be applied by a measurement device for testing a device under test (DUT). In an embodiment, The method comprises at least the following steps: at least one first voltage requirement and at least one first timing requirement for a first power rail signal of the DUT to be tested are stored in a structured file format; at least one second voltage requirement and at least one second timing requirement for a second power rail signal of the DUT to be tested are stored in a structured file format; and at least one relative constraint having a relation between at least two of voltage requirements and timing requirements is stored in a structured file format.

The method briefly described above allows a respective signal test specification to be generated in view of not only the specific requirements for specific power rail signals, but also in view of relative constraints between the various requirements. Therefore, also relative conditions may be considered within the signal test specification. Moreover, the need for testing persons to manually consider all various requirements and constraints may advantageously be avoided. Also, the DUT is not limited to a having a single complex electronic device (CED), such as a field-programmable gate array (FPGA) or application-specific integrated circuit (ASIC). In some embodiments, such CEDs may separately require different requirements and constraints to be fulfilled. Moreover, relative constraints between different CEDs may be needed to be respected as well. Therefore, the complexity of the testing procedure to be performed for evaluating correct functionality of the DUT may be significantly increased if multiple CEDs are included. However, the example method advantageously guarantees that a single signal test specification in view of the DUT is generated which may subsequently be followed point by point by a testing person. In other words, the example method is independent of the overall number of requirements and relative constraints. Accordingly, the risk of false testing is greatly reduced.

Within the present context, a measurement device may be considered a device applied to test a functionality of the DUT, e.g. a test instrument. In some embodiments, the measurement device may be configured to separately apply different supply voltages to the DUT, for example to different power rails of the DUT. Moreover, the measurement device may be configured to include timing requirements when applying the supply voltages to the DUT.

Within the present context, a signal test specification may be considered a collection of requirements and relative constraints which need to be respected when testing a functionality of the DUT by the measurement device for evaluating the DUT. Based on the signal test specification an appropriate sequence of measurement steps of a testing procedure may be determined.

Within the present context, a voltage requirement may be considered a requirement specifying at least one voltage amplitude related property of a supply voltage to be regarded in view of the respective supply voltage to be applied to the DUT.

Within the present context, a timing requirement may be considered a requirement specifying at least one time related property of the supply voltage to be regarded in view of the respective supply voltage to be applied to the DUT.

Within the present context, a power rate signal may be considered a voltage signal to be applied to a specific power rail of the DUT.

Within the present context, the relative constraint may be considered to establish some interrelation between at least two requirements. The interrelated requirements may be any of voltage requirement(s) and timing requirement(s). This means that the relative constraint may in a first exemplary case define an interrelation between at least two voltage requirements. In a second exemplary case, the relative constraint may define an interrelation between at least two timing requirements. In a third representative case, the relative constraint may define an interrelation between at least one voltage requirement and at least one timing requirement.

Optionally, the relative constraint may also define an interrelation between more than two requirements, no matter whether the involved requirements relate to a voltage requirement or a timing requirement.

Within the present context, a structured file format may be considered a data file format according to which both the underlying data (such as a requirement) and the file structure are stored in the same file.

Optionally, the structured file format used for storing the requirements and relative constraint may be same or may be different from each other. Hence, the first voltage requirement and the first timing requirement, the second voltage requirement and the second timing requirement as well as the relative constraint are stored in the same structured file format. For example, it may be more easy storing requirements and relative constraints by using different structured file formats.

However, in a certain embodiment only a single structured file format is used for storing the requirements for the different power rail signals.

In some embodiments, the structures file format is the same for storing the requirements for the different power rail signals as well as for storing the relative constraint. Optionally, the signal test specification may comprise a power rail signal test specification. In other words, the signal test specification may particularly specify voltage requirements, timing requirements and relative constraints for the power rails of the DUT.

In some embodiments, the labor costs and risks of potential failures are reduced. Even further, the approach may preferably establish the possibility to automatically apply a respective testing procedure for power sequence verification of at least one CED.

An aspect provides that the relative constraint comprises, for example, at least one multi-rail level constraint or at least one multi-rail timing constraint. The multi-rail level constraint has a relationship between at least two voltage requirements for different power rail signals. The multi-rail timing constraint has a relationship between at least two timing requirements for different power rail signals. Accordingly, the signal test specification may include interrelations in view of different power rail signals for different power rails of the DUT to be regarded. For this reason, the signal test specification is for example suitable if the DUT comprises different CEDs.

In some embodiments, the at least one relative constraint concerns the first power rail signal and the second power rail signal. In some cases, it may be sufficient to consider only two power rail signals, for example if the underlying CED is of a rather low complexity. Therefore, the signal test specification may be compact.

Optionally, the relative constraint, the requirements for the first power rail signal and the requirements for the second power rail signal are stored by the same structured file format. Accordingly, the signal test specification may be configured to be read using a single structured file format. Hence, the signal test specification may be more convenient in view of a further use for a testing procedure.

In some embodiments, the method further comprises the step that for each power rail signal a specific channel of the measurement device associated thereto is stored in a structured file format. Spoken differently, the signal test specification may already include information in view of a subsequent testing procedure. Namely, it may be specified which channel of a measurement device used for testing the DUT is to be used in view of a specific power rail signal. Accordingly, an additional source of potential testing errors is circumvented since the test person may already recognize from the signal test specification the specific channel to be used for a specific power rail signal. Moreover, the comfort for the test person is improved since the test person does not need to conclude anymore which channel is to be used for which signal. Consequently, the efficiency of a subsequent testing procedure using the signal test specification is also improved since the required information is already provided.

In some embodiments, the voltage requirement comprises at least one of a maximum voltage, a minimum voltage, and an average voltage. Therefore, a supply voltage used with the first power rail signal is appropriately specified such that the properties of the DUT are fully taken into account.

In some embodiments, the timing requirement comprises at least one of a maximum time period, minimum time period, a slew rate, a rise time, a fall time, a start time, an end time, a delay, a phase shift, a pulse width, a duty cycle, a periodic length, a frequency, a shape of a waveform, a monotonicity, and a power rail event. These different aspects of the timing requirement directly influence the sequence of a testing procedure applied to evaluate the functionality of the DUT. Therefore, the timing requirement specifically enables to take all possible properties with regard to a required timing of the testing sequence into account. Accordingly, CEDs included within the DUT may be appropriately powered.

In some embodiments, the structured file format comprises at least one of xml, j son, or yaml. These types of structured file formats provide the possibility to efficiently program and generate the signal test specification. In some embodiments, conditions may be easily included.

Optionally, the DUT comprises at least one of a field programmable gate array (FPGA), an application-specific integrated circuit (ASIC), and a complex electronic device (CED) dealing with multiple signals. In some embodiments, the respective device of the DUT comprises at least two power rail signals to be powered for evaluating the functionality of the DUT. Of course, the respective device may also comprise more than two power rail signals to be powered.

In some embodiments, the complex electronic device may particularly comprise a data processing circuit or a processing system. Data processing circuits or processing systems comprise various separate electronic devices which have to be powered taking respective power sequences and appropriate powering conditions (properties) into account. Therefore, testing of such CEDs requires to evaluate their correct functionality for which the underlying signal test specification is provided herewith.

In some embodiments, the method may also include that in view of one or multiple power rail signals more than one voltage requirement and/or timing requirement is stored in the structured file format.

Moreover, the method may also include that more than one relative constraint between at least two requirements are stored in the structured file format.

Accordingly, any possible complexity of a testing procedure which is required to appropriately evaluate the functionality of a DUT may be regarded when generating the signal test specification.

Optionally, a database may be used for defining the respective voltage requirements, timing requirements, and relative constraints. For example, the database may specify certain properties of the DUT which are to be regarded. Based on these properties the signal test specification may then be generated by storing respective requirements and relative constraints while taking the underlying properties of the DUT into account. In other words, the method may include that a certain device, such as a data processing circuit, concludes from a property sheet of the DUT which specific requirements and relative constraints have to be stored, such that a testing procedure based on the generated signal test specification may evaluate whether the underlying properties and conditions are met.

According to another aspect, a data processing circuit, for example, is coupled to a memory device and configured for carrying out any of the computer-implemented method as described hereinabove.

Accordingly, the data processing circuit may particularly be configured for automatically generating the signal test specification. Optionally, a database defining the respective properties of the DUT may be taken into account to conclude about the respective voltage requirements, timing requirements, and relative constraints. The data processing circuit provides the possibility to avoid manual work expenses to generate respective signal test specifications in order to evaluate the functionality of the DUT. Hence, the efficiency of establishing the signal test specification is greatly improved.

In a certain embodiment, the data processing circuit may be part of a measurement device used for testing the DUT. For example, the measurement device may comprise a data acquisition device. In some embodiments, the data acquisition device may be configured to not only apply a testing procedure to evaluate the functionality of a DUT, but may as well be configured to generate a signal test specification as described above. For example, initially the signal test specification may be generated while, subsequently, a respective testing procedure may be applied using the signal test specification.

In some embodiments, the memory device is used for storing the voltage and timing requirements and the at least one relative constraint in the respective structured file formats.

In some embodiments, the memory device may comprise a non-volatile memory device.

Optionally, the data processing circuit is configured to determine a measurement test sequence based on the generated signal test specification. In other words, taking the generated signal test specification into account, the data processing circuit may conclude how a testing procedure is required to be performed to prove the signal test specification. At least caused by the relative constraint and the timing requirements, the testing procedure establishes a measurement test sequence to evaluate the functionality of the DUT. Therefore, the correct sequence of powering different power rail signals is taken into account.

In some embodiments, the measurement test sequence is automatically executable. Hence, an automatic power sequencing test functionality is established. The measurement test sequence comprises constraint tests and/or limit tests such that each voltage requirement, timing requirement, and relative constraint is verifiable. Accordingly, the so determined measurement test sequence is particularly suited to evaluate fulfillment of all defined voltage requirements, timing requirements, and relative constraints. Thus, the manual work expenses to perform the testing procedure are greatly reduced.

In some embodiments, the data processing circuit is configured to store in a structured file format at least one tolerance value assigned to at least one voltage or timing requirement. Therefore, deviations from the specified voltage requirements and timing requirements do not necessarily cause failure of the measurement test sequence. Rather, if the deviations from the nominal values are within the tolerance value the respective requirement may be considered to be met. Hence, for example certain deviations arising from manufacturing variations do not immediately lead to error results.

Optionally, the data processing circuit is configured to store in a structured file format at least one sequence of voltage and timing requirements to be followed when testing the DUT. Here, it is emphasized, that the measurement test sequence, subsequently used for testing the DUT, also takes the specifics of the respective sequence to be followed into account. Therefore, a false powering sequence of the DUT may be avoided.

In specific embodiments, the data processing circuit is configured to generate instructions to carry out the measurement test sequence determined. In other words, the data processing circuit may be configured to at least indirectly initiate the measurement test sequence. For example, the data processing circuit may be coupled to a downstream device and may generate specific commands for the downstream device such that the downstream device carries out the measurement test sequence. In this regard, the data processing circuit may be coupled to the downstream device.

Optionally, the data processing circuit is configured to generate representation instructions for a graphical user interface (GUI) to illustrate test results obtained when performing the measurement test sequence. Therefore, a convenient graphical representation for a user or test person is provided. For example, requirements which are not met may be represented using a first color while requirements or relative constraints which are met during the measurement test sequence may be represented using a second color being different from the first color. Accordingly, the user may recognize the respective results in a very convenient fashion. To this end, the data processing circuit may be coupled to the GUI.

In some embodiments, the data processing circuit is part of an oscilloscope. Put differently, an oscilloscope may be provided that comprises the data processing circuit. An oscilloscope usually comprises multiple channels and, therefore, may be used to evaluate separate power rail signals independent from each other. Moreover, an oscilloscope may optionally also be configured to provide the test results to a GUI. Therefore, the oscilloscope may not only be configured to perform the measurement test sequence itself but also to generate the signal test specification underlying the measurement test sequence.

According to another aspect, a cloud system comprising the data processing circuit as described hereinabove is provided. In other words, the data processing circuit may be coupled to a communication device such that the data processing circuit may communicate with at least one distant data processing circuit, e.g. a remotely located one. The distant data processing circuit may for example be part of a server device. Generally, the cloud system includes multiple data processing circuits which are communicatively coupled to each other. The data processing circuits may optionally be part of separate server devices. Thus, data may be exchanged among the multiple data processing circuits being part of the cloud system. This provides the possibility to distribute generated signal test specifications using the cloud system. Therefore, it may be avoided that each data processing circuit is required to generate a signal test specification on its own.

The underlying communication may, for example, be established through the Internet.

Optionally, generated measurement test sequences may be distributed within the cloud system as well. Hence, the single generation of a signal test specification and/or a measurement test sequence may be sufficient for appropriate testing procedures to be performed in view of separate DUTs, at least of the DUTs are of the same device type.

The cloud system also offers the possibility for retrofitting data processing circuits or measurement devices, such as oscilloscopes, which are already in use. The respective functionality can for example be provided by a firmware update. Therefore, the comfort for the user is greatly improved.

According to yet another aspect, a data acquisition device comprising the data processing circuit as described hereinabove and/or an interface coupled to the cloud system as described hereinabove is provided. Therefore, a user may be provided with a single data acquisition device which is configured to respectively generate the signal test specification for offering the possibility to appropriately evaluate the functionality of a DUT.

In some embodiments, the interface may comprise a communication device.

The oscilloscope may also include the data acquisition device. In other words, the data acquisition device may be established by the oscilloscope.

Optionally, the data acquisition device is configured to carry out the measurement test sequence determined by the data processing circuit. For example, the data acquisition device may comprise an oscilloscope. In other words, the data acquisition device may be configured to not only generate the respective signal test specification but as well be configured to generate the respective image test sequence. Therefore, the entire functionality required to appropriately evaluate the DUT may be combined in a single device.

In a certain embodiment, the data acquisition device is configured to carry out the measurement test sequence determined by the data processing circuit and is further configured to automatically generate a report on whether the constraint tests and/or limit tests are passed or violated. Accordingly, a noticeable result overview is provided for a user such that the user may easy recognize whether the DUT meets all requirements and constraints. Thus, the comfort for the user is further improved.

Based on the definition of power rails and constraints, the automatic power sequencing test functionality automatically performs the corresponding measurements on signals that are captured with a data acquisition unit like an oscilloscope, wherein any violations of the power sequencing requirements are shown.

All features and embodiments disclosed with respect to any aspect of the present disclosure are combinable alone or in (sub-)combination with any one of the remaining aspects of the present disclosure including each of the embodiments thereof.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed. Similarly, any steps described herein may be interchangeable with other steps, or combinations of steps, in order to achieve the same or substantially similar result. Moreover, some of the method steps can be carried serially or in parallel, or in any order unless specifically expressed or understood in the context of other method steps.

All of the features disclosed hereinafter with respect to the example embodiments and/or the accompanying FIGURES can alone or in any sub-combination be combined with features of the aspects of the present disclosure including features of various embodiments thereof.

Figure 1:
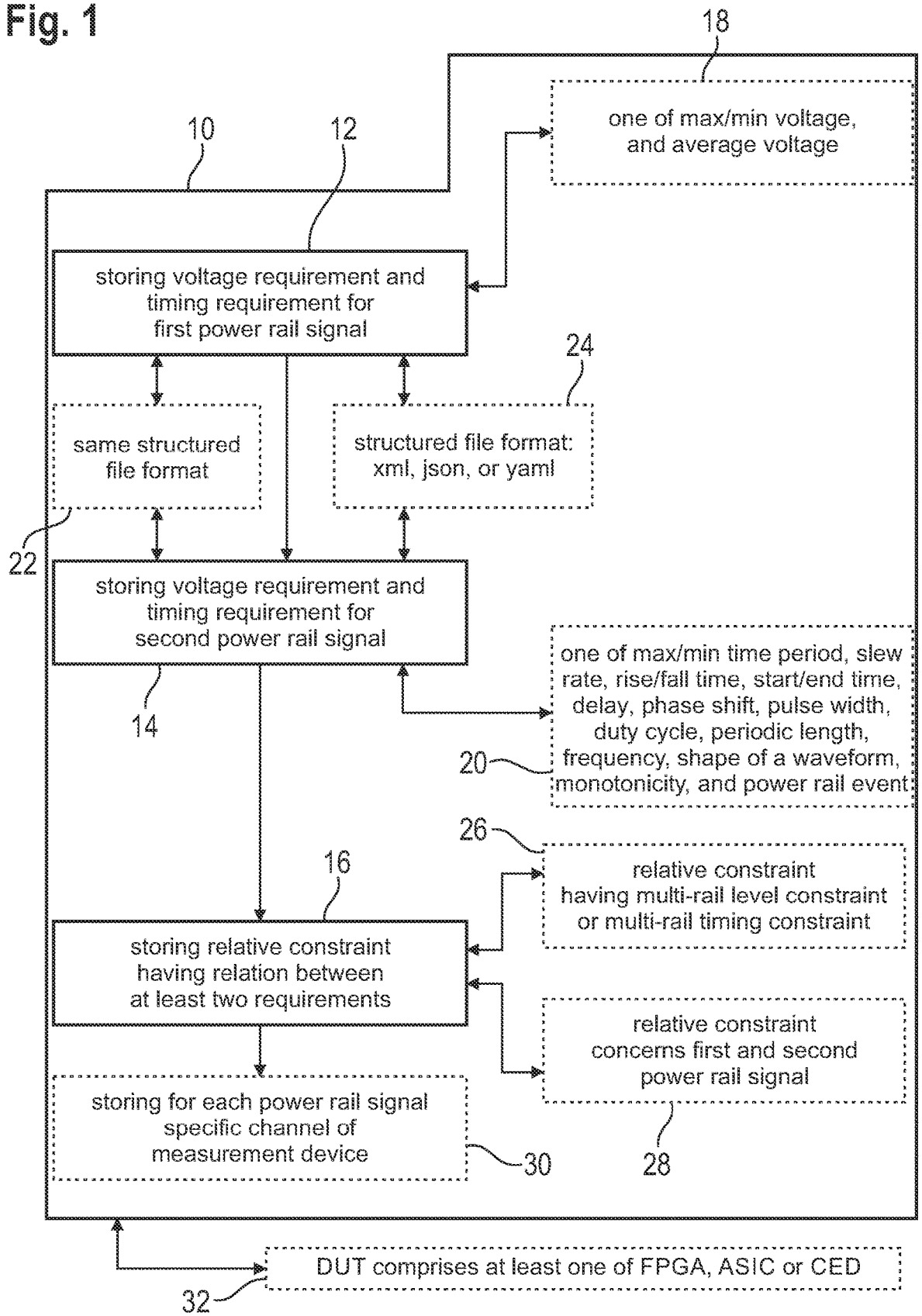
FIG. 1 is a schematic drawing of a representative computer-implemented method for generating a signal test specification.

FIG. 1 is a schematic drawing of a computer-implemented method 10 for generating a signal test specification. The signal test specification is generated so as to be applied by a measurement device for testing a device under test (DUT). Optional steps or features are shown in dashed lines.

The method 10 comprises the step 12 of storing, in a structured file format, at least one first voltage requirement and at least one first timing requirement for a first power rail signal of the DUT to be tested.

In subsequent step 14, at least one second voltage requirement and at least one second timing requirement for a second power rail signal of the DUT to be tested are stored in a structured file format.

Moreover, in step 16, at least one relative constraint having a relation between at least two of voltage requirements and timing requirements are stored in a structured file format.

Generally, in view of steps 12, 14, and 16 different or same structured file formats may be used. For example, the same structured file formats may be used which will keep the generated signal test specification compact. However, in some use cases different structured file formats may be used to more appropriately define the respective requirements and relative constraints.

Figure 4:
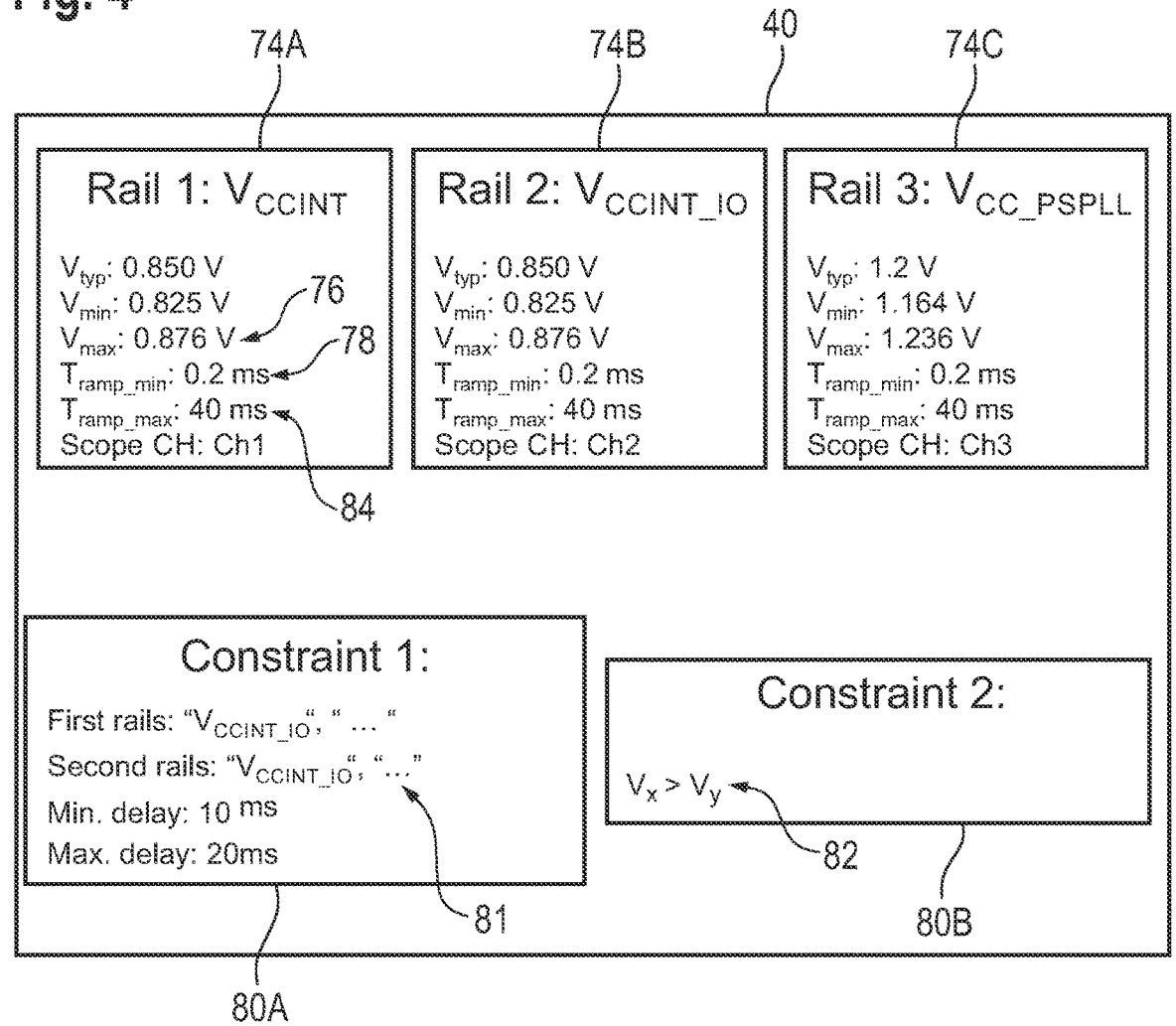
FIG. 4 is a schematic drawing of a signal test specification.

Accordingly, a signal test specification is generated which includes all relevant voltage requirements, timing requirements, and relative constraints such that appropriate powering of the DUT may in principle be verifiable. An example of such a signal test specification is shown in FIG. 4 to which reference is made later.

Therefore, manual work expenses for considering an appropriate test specification may be avoided. In contrast, the signal test specification may be established in an automatic fashion. For example, a data sheet describing the properties of the DUT may be included for storing appropriate requirements and constraints.

According to optional feature 18 of method 10, a voltage requirement may include at least one of a maximum voltage, a minimum voltage, and an average voltage. Accordingly, the standards of the power rail signals may be respected in view of the voltage properties.

Furthermore, according to optional feature 20 of method 10, a timing requirement may include at least one of a maximum time period, minimum time period, a slew rate, a rise time, a fall time, a start time, an end time, a delay, a phase shift, a pulse width, a duty cycle, a periodic length, a frequency, a shape of a waveform, a monotonicity, and a power rail event. Consequently, all possible required time related properties may be appropriately described and demanded.

According to optional feature 22, the structured file format used for storing the requirements in view of the first power rail signal and the second power rail signal may be same. Hence, the complexity of the signal test specification may be reduced compared to a configuration of using different structured file formats.

Optional feature 24 illustrates that the structured file format may be at least one of xml, json, or yaml. These structured file formats are well suited for storing the respective requirements and relative constraints.

According to optional features 26, the at least one relative constraint stored according to step 16 of method 10 comprises at least one multi-rail level constraint or at least one multi-rail timing constraint. In this regard, a multi-rail level constraint has a relationship between at least two voltage requirements for different power rail signals. For example, a multi-rail level constraint may comprise the condition that a voltage for a first power rail signal needs to be lower than a voltage for a second power rail signal at all times. Likewise, a multi-rail timing constraint comprises a relationship between at least two timing requirements for different power rail signals. For example, the multi-rail timing constraint may comprise the condition that the duty cycle of a first power rail signal is always larger than the duty cycle of a second power rail signal.

Of course, multi-rail level or timing constraints may also comprise conditions having relationships between more than just two power rail signals. However, this is optional.

According to optional feature 28, the at least one relative constraint stored in step 16 of method 10 concerns the first power rail signal and the second power rail signal. In other words, the relative constraint comprises a condition between at least two requirements, no matter whether timing or voltage requirements, but wherein the requirements are not belonging to the same power rail signal. Rather, the requirements are associated to the first power rail signal and the second power rail signal.

In essence, method 10 provides information how the power rail signals have to be tested and which relative constraints have to be respected. The signal test specification is generated in view of the measurement device which itself is used to test the DUT. For testing the individual power rail signals of the DUT the measurement device usually comprises several measurement channels (in short: channels). To further simplify the instructions for a user wishing to perform the respective test, in optional step 30, for each power rail signal a specific channel of the measurement device associated thereto is stored using a structured file format. Optional step 30 therefore assists the test person to appropriately configure the measurement device when wishing to perform the respective test. The test user is relieved from the task to consider appropriate channels of the measurement device.

Method 10 may be further advanced by optional feature 32. According to optional feature 32, the DUT comprises at least one of a FPGA, ASIC, or a CED. These DUT device types comprise several device components which require appropriate power sequencing. In some embodiments, the voltage limits and timing conditions have to be respected. Also, these device components comprise several power rail signals which individually require certain powering conditions. Moreover, there are relative aspects which need to be considered (relative constraints). Thus, method 10 provides beneficial advantages by generating appropriate signal test specifications in view of such DUT device types.

Figure 2:
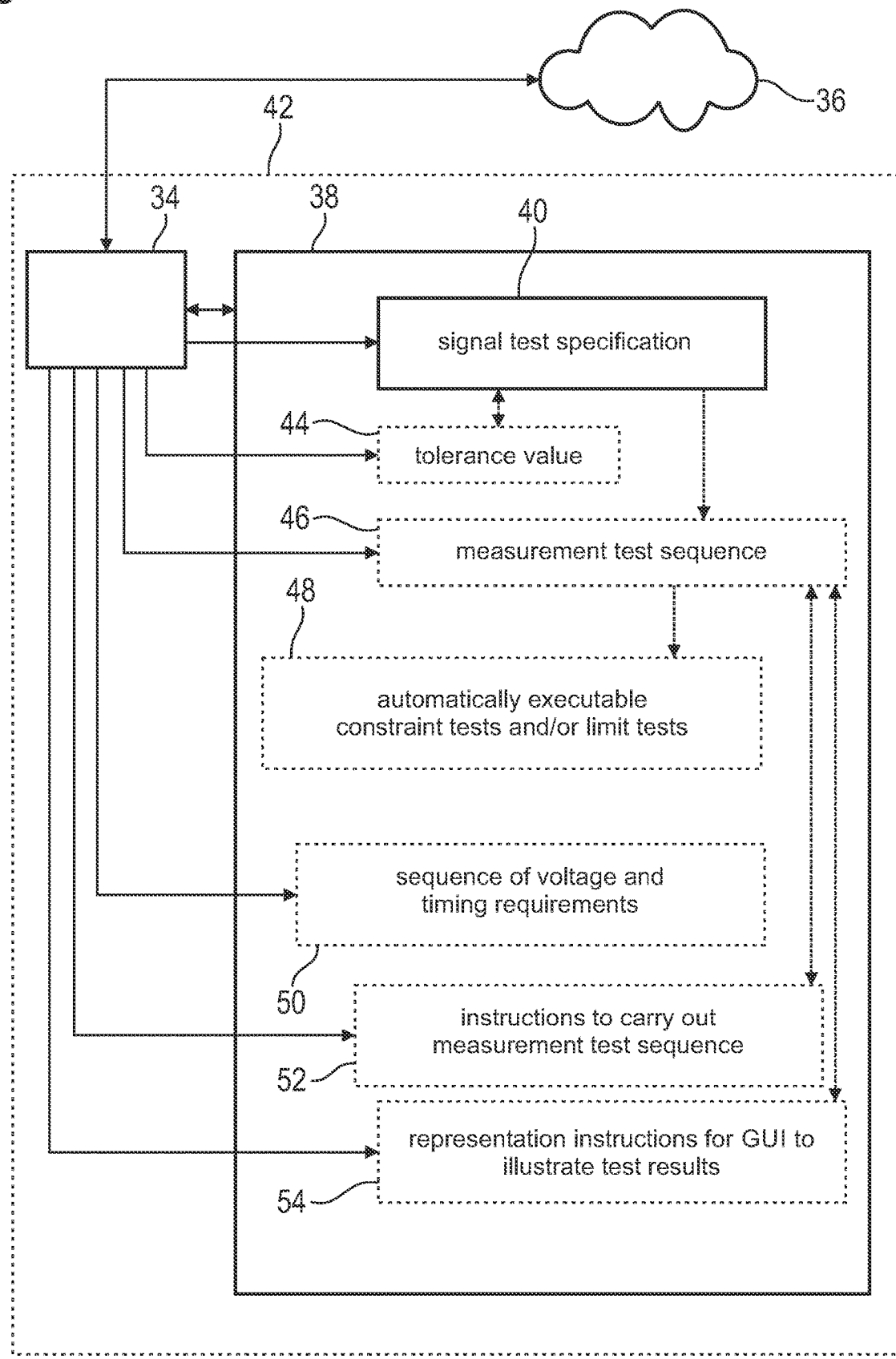
FIG. 2 is a schematic drawing of a representative data processing circuit and a cloud system.

FIG. 2 is a schematic drawing of a system that includes a representative data processing circuit 34 and a cloud system 36. Optional features are presented using dashed lines.

The data processing circuit 34 is coupled to a memory device 38 and configured to carry out, for example, the steps of method 10 as described before. Thus, the data processing circuit 34 is configured to generate the signal test specification 40 including the respective voltage requirements, timing requirements, and relative constraints which are stored within the memory device 38. Accordingly, the entire signal test specification 40 is stored within the memory device 38.

According to the present embodiment, the data processing circuit 34 is part of an oscilloscope 42. The oscilloscope 42 may be considered a data acquisition device generally configured to test the DUT.

In this regard, the data processing circuit 34 may also be configured to store at least one tolerance value 44 assigned to at least one voltage or timing requirement in a structured file format. In some embodiments, the tolerance value 44 is stored with the respective requirements within the memory device 38.

According to another aspect, the data processing circuit 34 is also configured, for example, to determine a measurement test sequence 46 based on the generated signal test specification 40. According to this embodiment, the determined measurement test sequence 46 is also stored with the memory device 38. Alternatively, the measurement test sequence 46 may not need to be stored but may be concluded from the signal test specification 40 and may subsequently be executed. In other words, the measurement test sequence 46 does not necessarily need to be considered a closed data set being stored.

In an example implementation according to optional feature 48, the measurement test sequence 46 may be determined by the data processing circuit 34 such that it is automatically executable. In this regard, the measurement test sequence 46 comprises constraint tests and/or limit tests such that each voltage requirement, timing requirement, and relative constraint of the signal test specification 40 is verifiable.

Moreover, the data processing circuit 34 may also be configured to store in a structured file format at least one sequence 50 of voltage and timing requirements to be followed when testing the DUT. Within the present embodiment, the sequence 50 is also stored with the memory device 38.

Additionally, the data processing circuit 34 may also be configured to generate instructions 52 to carry out the determined measurement test sequence 46. Such instructions 52 may for example be helpful if the data processing circuit 34 is not used to carry out the measurement test sequence 46 itself but if the measurement test sequence 46 is to be executed by a different downstream device. In this case, the respective instructions 52 may be provided to the different downstream device such that this device may carry out the measurement test sequence 46.

Furthermore, the data processing circuit 34 may also be configured to generate representation instructions 54 for a graphical user interface (GUI) to illustrate test results obtained when performing the measurement test sequence 46. Accordingly, the comfort for the user is improved since test results may be illustrated such that the user may easily recognize whether tests have been passed or violated.

According to the present embodiment, the data processing circuit 34 is coupled to a cloud system 36. The cloud system 36 may be considered a decentralized system of several data processing circuits 34. Optionally, the cloud system 36 may also comprise dedicated server devices.

If a signal test specification 40 is generated by a first data processing circuit 34 in view of a specific DUT, the generated signal test specification 40 may be distributed via the cloud system 36 to different data processing circuits 34 coupled thereto. Therefore, for different data processing circuits 34 the need to generate a signal test specification 40 may be omitted. Likewise, the stored tolerance values 44, the determined measurement test sequence 46, the stored sequence 50 of voltage and timing requirements to be followed when testing the DUT, the instructions 52 to carry out the determined measurement test sequence 46, and the representation instructions 54 for a GUI may also be distributed via the cloud system 36. Consequently, at least if same DUTs are concerned, the required data processing expenses may be greatly reduced for the system of coupled data processing circuits 34 by the coupling through the cloud system 36.

Figure 3:
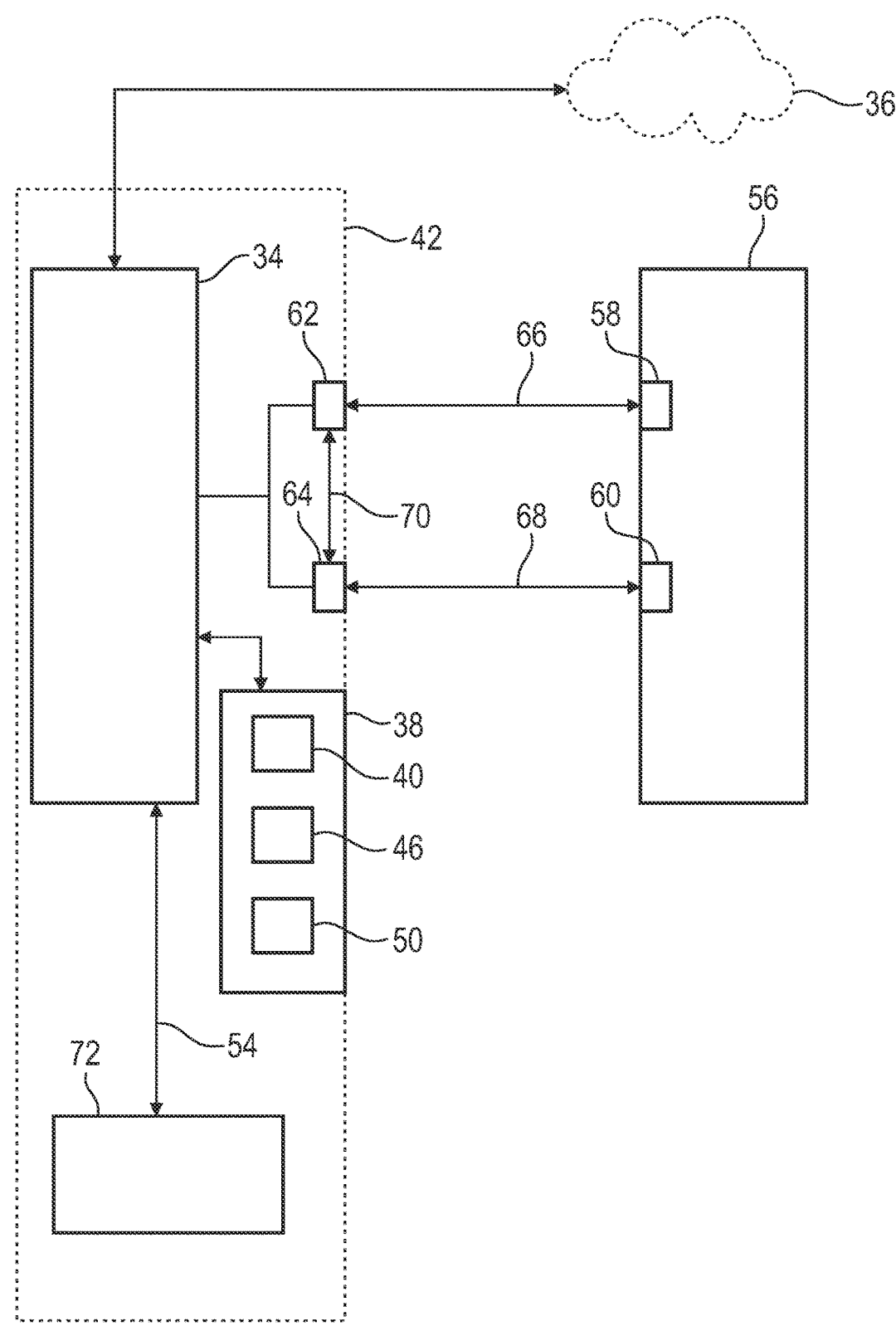
FIG. 3 is a schematic drawing of a representative data processing circuit and a device under test.

FIG. 3 is a schematic drawing of a system including a data processing circuit 34 and a device under test (DUT) 56. According to the present embodiment, the DUT 56 is a CED having a first power rail 58 and a second power rail 60. The first power rail 58 and the second power rail 60 require several voltage conditions, timing conditions and relative constraints to be respected.

The data processing circuit 34 is part of an oscilloscope 42 and coupled to a first channel 62 and a second channel 64 of the oscilloscope 42. The different channels 62, 64 are generally usable to acquire voltage related and timing related data of devices coupled thereto.

The data processing circuit 34 is coupled to a memory device 38. Within the memory device 38 at least the signal test specification 40, the measurement test sequence 46, and the sequence 50 of voltage and timing requirements to be followed when testing the DUT 56 are stored.

According to this embodiment, the data processing circuit 34 is also configured to execute the measurement test sequence 46 in view of the DUT 56. In this regard, the first channel 62 of the oscilloscope 42 is used and coupled via a first communication connection 66 to the first power rail 58 of the DUT 56. Likewise, the second channel 64 of the oscilloscope 42 is coupled via a second communication connection 68 to the second power rail 60 of the DUT 56.

The data processing circuit 34 evaluates the first communication connection 66 and the second communication connection 68 with regard to the first power rail signal and the second power rail signal. In some embodiments, the data processing circuit 34 applies respective limit tests to evaluate the voltage requirements and timing requirements for each of the power rails 58, 60 of the DUT 56. In this regard, the sequence 50 of voltage and timing requirements to be followed when testing the DUT 56 is applied by the data processing circuit 34.

Moreover, the data processing circuit 34 also applies respective constraint tests to evaluate the relative constraints between the different requirements via cross relations 70 taking place between the first channel 62 and the second channel 64 of the oscilloscope 42.

Figure 5:
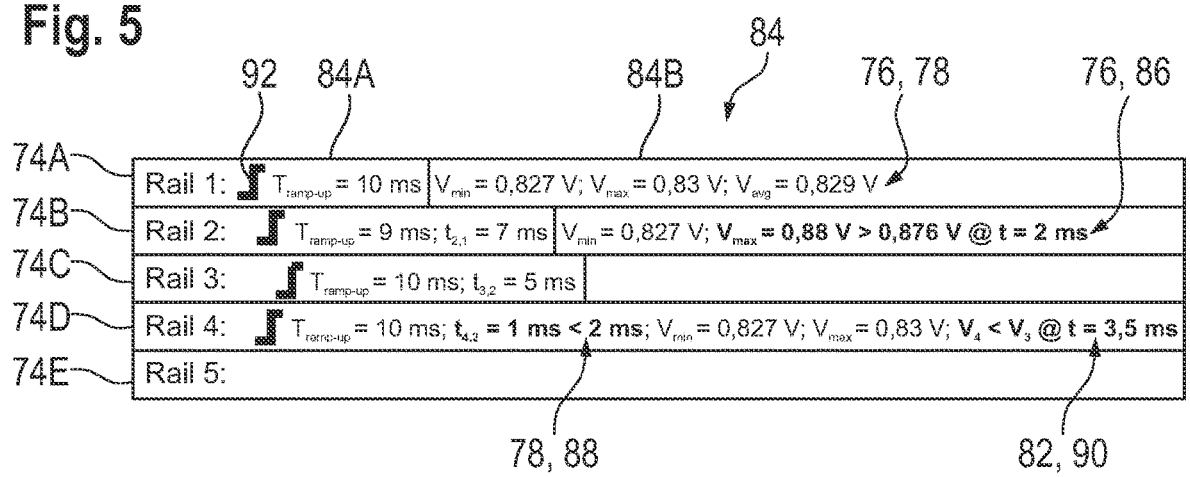
FIG. 5 is a schematic drawing of a graphical representation of requirements, relative constraints, and test results.

Based on the results of the measurement test sequence 46 the data processing circuit 34 makes use of the representation instructions 54 to illustrate the test results via a GUI 72 of the oscilloscope 42. This is illustrated in FIG. 5 to which reference is made in more detail.

Optionally, the data processing circuit 34 is coupled to the cloud system 36 to distribute information such as the generated signal test specification 40.

In essence, based on the data processing circuit 34 the oscilloscope 42 may be used not only to generate the signal test specification 14 but as well to determine a measurement test sequence 46. In addition, the data processing circuit 34 may be used to perform the respective tests in view of the DUT 56 while including the respective sequence 50 of voltage and timing requirements. Finally, the test results may be illustrated using the GUI 72. Consequently, the comfort for the user is greatly improved. The testing procedure of the DUT 56 is greatly simplified and may even be carried out automatically. The risk of false measurement steps is reduced and appropriate power testing of the DUT 56 is guaranteed.

FIG. 4 is a schematic drawing of a signal test specification 40 stored in a structured file format, here j son. According to the present embodiment, the signal test specification 40 comprises a first portion 74A, a second portion 74B, and a third portion 74C concerning the first power rail 58, the second power rail 60, and a third power rail of the DUT 56, respectively.

Each portion 74A to 74C comprises several voltage requirements 76 and timing requirements 78 which specify respective conditions to be considered in view of the individual power rails.

According to this embodiment, for each portion 74A to 74C in view of the different power rails of the DUT 56 a channel information is provided. The channel information defines the respective channel of the data acquisition device, for example the oscilloscope 42, to be used when evaluating the respective requirements 76, 78 and the constraints 81, 82. Hence, the comfort for the user is high.

Moreover, the signal test specification 40 also comprises a portion 80A concerning at least one absolute constraint 81 and a second portion 80B concerning at least one relative constraint 82, respectively. The constraints 81, 82 may be derived based on the voltage requirements 76 and the timing requirements 78.

The absolute constraints 81 generally concern each power rail individually, for instance minimum and maximum voltage after ramp-up, minimum and maximum ramp-up time and other possible constraints like a monotonicity constraint during power-up or power-down (i.e. the voltage of a power rail is only allowed to increase during power-up or only allowed to decrease during power-down).

The relative constraint 82 specify relations between voltage requirements 76 and/or timing requirements 78, which are to be followed while testing the DUT 56. As mentioned above, the relative constraint 82 may be a multi rail level constraint like a relative voltage or current constraint between two power rails. For example, the relative constraint 82 defines that the voltage of the first power rail ("Rail 1") has always to be larger than the voltage of the second power rail ("Rail 2").

For example, according to the relative constraint 82 the voltage Vx is required to be larger than Vy. Since no time limitation is provided in view of the relative constraint 82, the relative constraint 82 needs to be fulfilled at all times.

In the shown embodiment, the voltage Vx may relates to the voltage of the third power rail ("Rail 3"), whereas the voltage Vy may relate either to the voltage of the first power rail ("Rail 1") or to the voltage of the second power rail ("Rail 2").

FIG. 5 is a schematic drawing of a graphical representation 84 of requirements and test results. For outputting the graphical representation 84 the GUI 72 may be used.

The respective representation instructions 54 underlying the graphical representation 84 may be provided by the data processing circuit 34 to the GUI 72 as already described above.

According to the present embodiment, the graphical representation 84 comprises separate sections 74A to 74E in view of the different power rails ("Rail 1" to "Rail 5") of the DUT 56.

In the shown embodiment, the graphical representation 84 comprises in view of the different sections 74A to 74E at least a first portion 84A and second portion 84B. Within the first portion 84A for each power rail, such as the first power rail 58, at least the respective timing requirement(s) 78 are/is displayed. Within the second portion 84B for each power rail, at least the respective voltage requirement(s) 76 are/is displayed. Optionally, respective relative constraint(s) 82 may be displayed within a third portion (not shown) that adjoins the second portion 84B.

Further, the respective values measured in view of the respective voltage requirement(s) 76, timing requirement(s) 78, and, optionally, the relative constraint(s) 82 are also displayed in the corresponding portions.

If the measured values meet the respective requirements 76, 78 (and relative constraints 82), the acquired values will be displayed using a standardized format according to the present embodiment, e.g. the same format that is used for the respective requirement(s).

In contrast, as shown for the second power rail 60 ("Rail 2"), a different format, e.g. bold letters, is used to indicate a voltage requirement violation 86. The respective violation is illustrated within the respective second portion 84B of the graphical representation 84, which also illustrates the respective requirement that is violated. Hence, the user obtains both information in close relationship to each other.

Moreover, the voltage requirement violation 86 also includes information with regard to the time of the violating event, namely at a time of t=2 ms indicated by "@ t=2 ms".

As a further illustrative example, in view of the fourth power rail ("Rail 4") a timing requirement violation 88 and a violation 90 of a multi-rail relative constraint 82 with regard to voltage requirements 78 are displayed in the first portion 84A and the second portion 84B, wherein the different format is used again, namely bold letters.

Since the relative constraint violation relates to voltage requirement(s), the respective violation is illustrated in the second portion 84B associated with the voltage requirement(s). Again, the illustrated violation 90 of the multi-rail relative constraint 82 also includes information with regard to the time of the violating event, namely at a time of t=3.5 ms indicated by "@ t=3.5 ms".

The different format used for indicating a violation may also include a different color compared to the one of the standard formats that is used for illustrating the respective requirement(s).

Accordingly, a violation of requirements 76, 78, and relative constraints 82 may also be displayed differently than by using bold letters. In other words, the graphical representation 84 may be adapted as desired.

However, values which meet the specific requirements 76, 78 and the relative constraints 82 and those that violate the requirements 76, 78 or relative constraints 82 will be displayed differently. Hence, a user may easily recognize the respective results.

According to the present embodiment, the graphical representation 84 further comprises an indicator 92 for automatically visualizing a certain requirement, e.g. a ramp-up time in the shown embodiment. Therefore, the user also obtains a visualization of a certain requirement that can be recognized easily without reading the specific name of the requirement, namely the term "Tramp-up" since the symbol used is unique and explicit.

Figure 6:
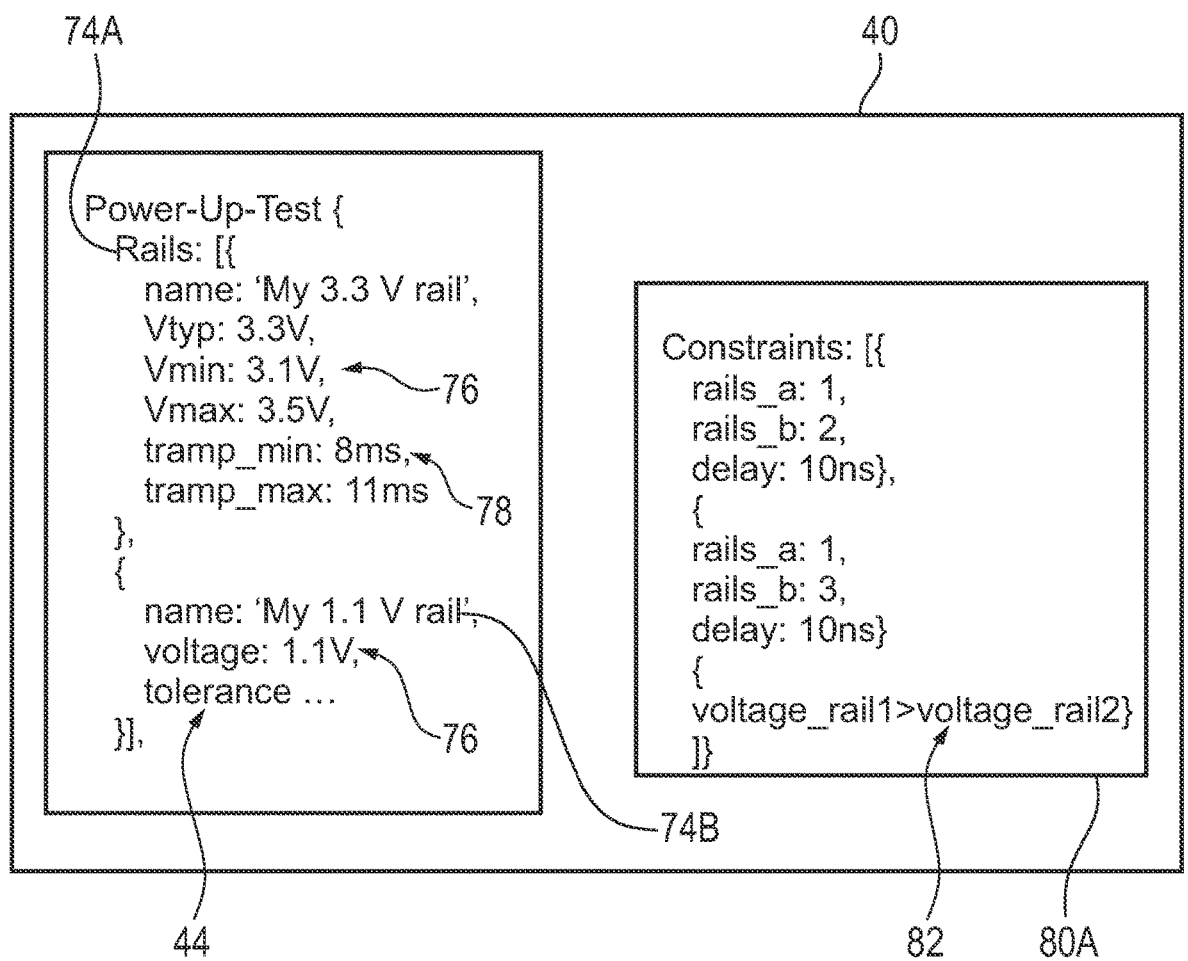
FIG. 6 is a schematic drawing of an exemplary signal test specification using a structured file format.

FIG. 6 is a schematic drawing of an example signal test specification 40 using a structured file format. According to the present embodiment, the structured data format "json" is used in this regard. This structured file format provides the possibility to easily extend the respective signal test specification 40. Hence, the programmed signal test specification 40 can be adapted easily while simultaneously providing compatibility for potential future applications.

The signal test specification 40 comprises several sections 74A, 74B being associated with different power rails of the DUT 56, e.g. the first and second power rails 58, 60 of the DUT 56. Moreover, the signal test specification 40 comprises an additional portion 80A being inter alia associated with the at least one relative constraint 82.

Using the structured file format, the various voltage requirements 76, timing requirements 78, and the at least one relative constraint 82 are programmed within the signal test specification 40. According to this embodiment, tolerance values 44 are also included within the signal test specification 40 with the respective requirement 76, 78 to which the tolerance value 44 is associated to. To illustrate the compatibility, json exemplarily provides the possibility to define the respective tolerance value 44 using different nomenclatures, such as using a percentage or using absolute values.

The so programmed signal test specification 40 may optionally be compiled to derive a measurement test sequence 46 thereof. Subsequently, the measurement test sequence 46 may be carried out by a data acquisition device, such as the oscilloscope 42, to verify correct power sequencing of the DUT 56.

Certain embodiments, or components thereof, such as data processing circuit 34, disclosed herein utilize circuitry (e.g., one or more circuits) in order to implement protocols, methodologies or technologies disclosed herein, operably couple two or more components, generate information, process information, analyze information, generate signals, encode/decode signals, convert signals, transmit and/or receive signals, control other devices, etc. Circuitry of any type can be used. It will be appreciated that the term "information" can be use synonymously with the term "signals" in this paragraph. It will be further appreciated that the terms "circuitry," "circuit," "one or more circuits," etc., can be used synonymously herein.

In an embodiment, circuitry includes, among other things, one or more computing devices such as a processor (e.g., a microprocessor), a central processing unit (CPU), a digital signal processor (DSP), an application-specific integrated circuit (ASIC), a field-programmable gate array (FPGA), a system on a chip (SoC), or the like, or any combinations thereof, and can include discrete digital or analog circuit elements or electronics, or combinations thereof.

In an embodiment, circuitry includes hardware circuit implementations (e.g., implementations in analog circuitry, implementations in digital circuitry, and the like, and combinations thereof). In an embodiment, circuitry includes combinations of circuits and computer program products having software or firmware instructions stored on one or more computer readable memories that work together to cause a device to perform one or more protocols, methodologies or technologies described herein. In an embodiment, circuitry includes circuits, such as, for example, microprocessors or portions of microprocessor, that require software, firmware, and the like for operation. In an embodiment, circuitry includes one or more processors or portions thereof and accompanying software, firmware, hardware, and the like.

In some examples, the functionality described herein can be implemented by special purpose hardware-based computer systems or circuits, etc., or combinations of special purpose hardware and computer instructions. Each of these special purpose hardware-based computer systems or circuits, etc., or combinations of special purpose hardware circuits and computer instructions form specifically configured circuits, machines, apparatus, devices, etc., capable of implemented the functionality described herein.

Of course, in some embodiments, two or more data processing circuit 34, cloud systems, etc., or parts thereof, can be integrated or share hardware and/or software, circuitry, etc. In some embodiments, these components, or parts thereof, may be grouped in a single location or distributed over a wide area. In circumstances where the components are distributed, the components are accessible to each other via communication links.

The present application may reference quantities and numbers. Unless specifically stated, such quantities and numbers are not to be considered restrictive, but exemplary of the possible quantities or numbers associated with the present application. Also in this regard, the present application may use the term "plurality" to reference a quantity or number. In this regard, the term "plurality" is meant to be any number that is more than one, for example, two, three, four, five, etc. The terms "about," "approximately," "near," etc., mean plus or minus 5% of the stated value. For the purposes of the present disclosure, the phrase "at least one of A and B" is equivalent to "A and/or B" or vice versa, namely "A" alone, "B" alone or "A and B.". Similarly, the phrase "at least one of A, B, and C," for example, means (A), (B), (C), (A and B), (A and C), (B and C), or (A, B, and C), including all further possible permutations when greater than three elements are listed.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The embodiments of the invention in which an exclusive property or privilege is claimed are defined as follows:

1. A computer-implemented method for generating a signal test specification to be applied by a measurement device for testing a device under test, the method comprising:
   storing, in a structured file format, at least one first voltage requirement and at least one first timing requirement for a first power rail signal of the device under test to be tested,
   storing, in a structured file format, at least one second voltage requirement and at least one second timing requirement for a second power rail signal of the device under test to be tested, and
   storing, in a structured file format, at least one relative constraint having a relation between at least two of voltage requirements and timing requirements,
   wherein the signal test specification includes all relevant voltage requirements, timing requirements, and relative constraints such that appropriate powering of the device under test is verifiable.

2. The method of claim 1, wherein the relative constraint comprises at least one multi-rail level constraint or at least one multi-rail timing constraint, wherein the multi-rail level constraint has a relationship between at least two voltage requirements for different power rail signals, and wherein the multi-rail timing constraint has a relationship between at least two timing requirements for different power rail signals.

3. The method of claim 1, wherein the at least one relative constraint concerns the first power rail signal and the second power rail signal.

4. The method of claim 1, wherein the relative constraint, the requirements for the first power rail signal and the requirements for the second power rail signal are stored by the same structured file format.

5. The method of claim 1, wherein the method further comprises:
   storing, in a structured file format, for each power rail signal a specific channel of the measurement device associated thereto.

6. The method of claim 1, wherein a voltage requirement comprises at least one of a maximum voltage, a minimum voltage, and an average voltage.

7. The method of claim 1, wherein a timing requirement comprises at least one of a maximum time period, minimum time period, a slew rate, a rise time, a fall time, a start time, an end time, a delay, a phase shift, a pulse width, a duty cycle, a periodic length, a frequency, a shape of a waveform, a monotonicity, and a power rail event.

8. The method of claim 1, wherein the structured file format comprises at least one of xml, json, or yaml.

9. The method of claim 1, wherein the device under test comprises at least one of a field programmable gate array, an application-specific integrated circuit, and a complex electronic device dealing with multiple signals.

10. A data processing circuit being coupled to a memory device and configured for carrying out the computer-implemented method according to claim 1, wherein the data processing circuit is configured to determine a measurement test sequence based on the generated signal test specification, wherein the measurement test sequence comprises constraint tests and/or limit tests such that each voltage requirement, timing requirement, and relative constraint of the signal test specification is verifiable.

11. The data processing circuit of claim 10, wherein the measurement test sequence is automatically executable, and wherein the measurement test sequence comprises constraint tests and/or limit tests such that each voltage requirement, timing requirement, and relative constraint is verifiable.

12. The data processing circuit of claim 10, the data processing circuit being configured to store in a structured file format at least one tolerance value assigned to at least one voltage or timing requirement.

13. The data processing circuit of claim 10, the data processing circuit being configured to store in a structured file format at least one sequence of voltage and timing requirements to be followed when testing the device under test.

14. The data processing circuit of claim 10, wherein the data processing circuit is configured to generate instructions to carry out the measurement test sequence determined.

15. The data processing circuit of claim 14, wherein the data processing circuit is configured to generate representation instructions for a graphical user interface to illustrate test results obtained when performing the measurement test sequence.

16. The data processing circuit of claim 10, wherein the data processing circuit is part of an oscilloscope.

17. A cloud system comprising the data processing circuit according to claim 10.

* * * * *